United States Patent
Yoshida et al.

(10) Patent No.: US 7,059,941 B2
(45) Date of Patent: Jun. 13, 2006

(54) POLISHING COMPOSITION (75) Inventors: Hiroyuki Yoshida, Wakayama (JP); Toshiya Hagihara, Wakayama (JP); Ryoichi Hashimoto, Wakayama (JP); Yasuhiro Yoneda, Wakayama (JP)

(73) Assignee: Kao Corporation, Tokyo (JP)

( * ) Notice: Subject to any disclaimer, the term of this patent is extended or adjusted under 35 U.S.C. 154(b) by 3 days.

(21) Appl. No.: 10/701,606

(22) Filed: Nov. 6, 2003

(65) Prior Publication Data

US 2004/0102142 A1 May 27, 2004

Related U.S. Application Data

(63) Continuation of application No. 09/983,271, filed on Oct. 23, 2001, now abandoned.

(30) Foreign Application Priority Data

Oct. 23, 2000 (JP) ........................................ 2000-322123

(51) Int. Cl.
*C09K 13/06* (2006.01)

(52) U.S. Cl. .................... 451/41; 438/690; 252/79.1

(58) Field of Classification Search ............... 451/41, 451/55, 287, 290, 364, 384, 397, 402; 51/283 R, 51/308; 252/79.1, 79.5; 438/690–693
See application file for complete search history.

(56) References Cited

U.S. PATENT DOCUMENTS

| | | | | |
|---|---|---|---|---|
| 4,169,337 A | * | 10/1979 | Payne ........................... | 451/41 |
| 4,462,828 A | * | 7/1984 | Otsuki ........................... | 106/3 |
| 4,944,836 A | * | 7/1990 | Beyer et al. ................. | 438/633 |
| 5,238,771 A | * | 8/1993 | Goto et al. ................... | 430/165 |
| 5,376,222 A | * | 12/1994 | Miyajima et al. ............. | 216/88 |
| 5,407,526 A | * | 4/1995 | Danielson et al. ........... | 438/693 |
| 5,425,988 A | * | 6/1995 | Ogawa et al. ................ | 428/333 |
| 5,486,129 A | * | 1/1996 | Sandhu et al. ................. | 451/5 |
| 5,494,857 A | * | 2/1996 | Cooperman et al. ......... | 438/437 |
| 5,643,406 A | * | 7/1997 | Shimomura et al. ......... | 438/693 |
| 5,736,462 A | * | 4/1998 | Takahashi et al. ........... | 438/692 |
| 5,935,871 A | * | 8/1999 | Farkas et al. ................. | 438/693 |
| 6,114,249 A | | 9/2000 | Canaperi et al. | |
| 6,420,269 B1 | * | 7/2002 | Matsuzawa et al. ......... | 438/693 |
| 6,428,721 B1 | * | 8/2002 | Ina et al. ..................... | 252/79.4 |
| 6,451,497 B1 | * | 9/2002 | Kunita ......................... | 430/191 |
| 6,468,711 B1 | * | 10/2002 | Sorori et al. ................. | 430/270.1 |
| 6,569,349 B1 | * | 5/2003 | Wang et al. ................. | 252/79.1 |
| 6,620,215 B1 | * | 9/2003 | Li et al. ........................ | 51/298 |

FOREIGN PATENT DOCUMENTS

| | | | |
|---|---|---|---|
| EP | 357205 A1 | * | 3/1990 |
| EP | 0 853 335 A2 | | 7/1998 |
| JP | 4163965 A2 | * | 4/1992 |
| JP | 864810 A2 | * | 8/1996 |
| JP | 9063996 A | | 3/1997 |
| JP | 10-270401 | | 10/1998 |
| JP | 11-279534 A | | 10/1999 |
| JP | 11116948 | * | 11/1999 |
| JP | 11-302633 A | | 11/1999 |
| JP | 11-330025 | | 11/1999 |
| JP | 2000136375 A | | 5/2000 |
| JP | 2000239653 A | | 9/2000 |

* cited by examiner

*Primary Examiner*—Lee D. Wilson
*Assistant Examiner*—Anthony Ojini
(74) *Attorney, Agent, or Firm*—Birch, Stewart, Kolasch & Birch, LLP

(57) ABSTRACT

A polishing composition comprising an improver of a ratio of a polishing rate of an insulating film to that of a stopper film, wherein the polishing rate of the stopper film is selectively decreased, comprising one or more compounds selected from the group consisting of a monoamine or diamine compound; a polyamine having three or more amino groups in its molecule; an ether group-containing amine; and a heterocyclic compound having nitrogen atom. The polishing composition can be used for removing an insulating film which has been embedded for isolation into a trench formed on a silicon substrate and sedimented outside the trench, thereby planing a surface of the silicon substrate.

7 Claims, 1 Drawing Sheet

POLISHING COMPOSITION

This application is a continuation of application Ser. No. 09/983,271, filed on Oct. 23, 2001 now abandoned, for which priority is claimed under 35 U.S.C. § 120; and this application claims priority of Application No. 2000-322123 filed in Japan on Oct. 23, 2000 under 35 U.S.C. § 119. The entire contents of each of the above-described applications are hereby incorporated by reference.

BACKGROUND OF THE INVENTION

1. Field of the Invention

The present invention relates to an improver of a ratio of a polishing rate of an insulating film to that of a stopper film. Further, the present invention relates to a polishing composition comprising the improver, a process for selectively increasing a ratio of a polishing rate of an insulating film to that of a stopper film using the improver, and a process for producing a substrate to be polished using the above-mentioned polishing composition.

2. Discussion of the Related Art

Conventionally, isolation region has been formed by a technique so-called LOCOS (Local Oxidation of Silicon) method. However, the LOCOS method does not meet the requirement for high-integration of the semiconductor of the recent year because an effective isolation region is narrowed in the LOCOS method. Therefore, recently, there has been employed a so-called STI (Shallow Trench Isolation) method comprising depositing a stopper film such as a silicon nitride film on a silicon substrate, embedding an insulating film such as a silicon oxide film in a trench part, planing an excessive insulating film in the external part of the trench by using chemical-mechanical polishing (CMP) to expose the stopper film, and thereafter removing the stopper film by etching. In the STI method, it is desired that a ratio of the polishing rate of the insulating film to that of the stopper film is increased in order to prevent dishing or thinning generated during polishing of the insulating film on a substrate to be polished, thereby achieving planarization of the insulating film.

Presently, a ceria polishing agent used as a polishing agent for STI-CMP exhibits a high polishing rate of an insulating film, and selectively controls a polishing rate of a stopper film, thereby achieving efficient planarization. However, as compared to a silica polishing agent, there arise some problems such that the ceria polishing agent is high in costs, and abrasive grains are not easily dispersed therein. On the other hand, a commercially available polishing agent has a low ratio of a polishing rate of an insulating film to that of a stopper film. Therefore, there arise a problem such that polishing is undesirably progressed at parts where trench portions are closely arranged, as compared to parts where there are fewer trench portions, so that thinning is likely to be generated. In addition, when a stopper film is made thicker in order to prevent thinning, there arise a problem such that an insulating film in the trench part remains in a large amount by removal of the stopper film after CMP, so that there is still yet a great difference in the levels (step height) between a silicon substrate surface and an insulating film surface.

There have been reported that a ratio of polishing rates can be increased by adding triethanolamine as disclosed in Japanese Patent Laid-Open No. Hei 11-330025, or adding tetramethylammonium hydroxide and hydrogen peroxide as disclosed in Japanese Patent Laid-Open No. Hei 10-270401. However, in the former method, there arise some problems such that addition of a large amount of triethanolamine so as to have a concentration of 10% by weight or more is needed in order to exhibit its effects, thereby increasing its costs including costs for waste water treatment. In the latter method, hydrogen peroxide is likely to be decomposed, so that its effects, including stability, are not sufficient.

An object of the present invention is to provide an improver of a ratio of a polishing rate of an insulating film to that of a stopper film for stably and selectively increasing the ratio of a polishing rate of an insulating film to that of a stopper film.

Another object of the present invention is to provide a polishing composition comprising the improver, a process for selectively increasing a ratio of a polishing rate of an insulating film to that of a stopper film, and a process for producing a substrate to be polished using the above-mentioned polishing composition.

These and other objects of the present invention will be apparent from the following description.

SUMMARY OF THE INVENTION

According to the present invention, there are provided:

[1] an improver of a ratio of a polishing rate of an insulating film to that of a stopper film, wherein the polishing rate of the stopper film is selectively decreased, comprising one or more compounds selected from the group consisting of:

(A) a monoamine compound represented by Formula (I):

(I)

wherein each of $R^1$, $R^2$ and $R^3$ is independently hydrogen atom, an alkyl group having 1 to 6 carbon atoms or an alkenyl group having 2 to 6 carbon atoms, with proviso that a total number of carbon atoms in $R^1$, $R^2$ and $R^3$ is from 1 to 8;

(B) a diamine compound represented by Formula (II):

(II)

wherein each of $R^4$, $R^5$, $R^7$ and $R^8$ is independently hydrogen atom, an alkyl group having 1 to 6 carbon atoms or an alkanol group having 1 to 6 carbon atoms; and $R^6$ is a linear, branched or cyclic alkylene group having 1 to 18 carbon atoms, or a group represented by Formula (III):

(III)

wherein each of $R^9$ and $R^{10}$ is independently hydrogen atom or an alkyl group having 1 to 6 carbon atoms; and each of a and b is an integer of from 0 to 9, with proviso that a total number of carbon atoms in Formula (III) is from 2 to 18;

(C) a monoamine compound represented by Formula (IV):

wherein each of $R^{11}$, $R^{12}$ and $R^{13}$ is independently hydrogen atom, an alkyl group having 1 to 8 carbon atoms, an alkanol group having 1 to 8 carbon atoms, an alkanediol group having 1 to 8 carbon atoms, an alkanetriol group having 1 to 8 carbon atoms or a group represented by $-(R^{14}O)_cR^{15}$; $R^{14}$ is an alkylene group having 1 to 4 carbon atoms; $R^{15}$ is hydrogen atom, an alkyl group having 1 to 18 carbon atoms or an acyl group having 1 to 18 carbon atoms; and c is an integer of from 1 to 20, with proviso that:

(i) at least one of $R^{11}$, $R^{12}$ and $R^{13}$ is an alkanediol group having 1 to 8 carbon atoms, an alkanetriol group having 1 to 8 carbon atoms or a group represented by $-(R^{14}O)_cR^{35}$, wherein $R^{35}$ is an alkyl group having 1 to 18 carbon atoms or an acyl group having 1 to 18 carbon atoms; or (ii) in a case where at least one of $R^{11}$, $R^{12}$ and $R^{13}$ is an alkanol group having 1 to 8 carbon atoms or a group represented by $-(R^{14}O)_cH$, at least one of the other groups is an alkyl group having 1 to 8 carbon atoms;

(D) a polyamine having three or more amino groups in its molecule;

(E) an ether group-containing amine; and (F) a heterocyclic compound having nitrogen atom;

[2] a polishing composition comprising the improver of item [1] above;

[3] a process for selectively increasing a ratio of a polishing rate of an insulating film to that of a stopper film, comprising applying the improver of item [1] above;

[4] a process for producing a substrate to be polished, comprising applying the polishing composition of item [2] above; and

[5] a polishing process comprising removing an insulating film which has been embedded for isolation into a trench formed on a silicon substrate and sedimented outside the trench with the polishing composition of item [2] above, thereby planing a surface of the silicon substrate.

DETAILED DESCRIPTION OF THE INVENTION

In the present invention, the phrase "a ratio of a polishing rate of an insulating film to that of a stopper film, wherein the polishing rate of the stopper film is selectively decreased" is hereinafter also referred to as 'selective ratio'. Therefore, the term "improver of a ratio of a polishing rate of an insulating film to that of a stopper film" (hereinafter also referred to as "improver of a selective ratio") refers to an agent having an action of increasing a ratio of a polishing rate of an insulating film to that of a stopper film in STI method by containing the improver of a selective ratio in the polishing composition, concretely, having an action of reducing the polishing rate of a stopper film without remarkably lowering the polishing rate of the insulating film. Here, as to the ratio of polishing rates to be increased by the improver of a selective ratio, i.e. (polishing rate of insulating film)/(polishing rate of stopper film), the improver of a selective ratio preferably has a selective ratio exceeding 3 to 4 that of the commercially available silica polishing agent, from the viewpoint of facilitating the detection of the end point of polishing (viewpoint of being capable of easily stopping polishing at a given position), and the viewpoint of planing a substrate to be polished after polishing. The selective ratio is preferably 6 or more, more preferably 8 or more, still more preferably 10 or more, especially preferably 15 or more. The polishing rate of each film is that determined by the method described in Examples set forth below.

The improver of a selective ratio of the present invention comprises, as described above, one or more compounds selected from the group consisting of:

(A) a monoamine compound represented by Formula (I):

wherein each of $R^1$, $R^2$ and $R^3$ is independently hydrogen atom, an alkyl group having 1 to 6 carbon atoms or an alkenyl group having 2 to 6 carbon atoms, with proviso that a total number of carbon atoms in $R^1$, $R^2$ and $R^3$ is from 1 to 8;

(B) a diamine compound represented by Formula (II):

wherein each of $R^4$, $R^5$, $R^7$ and $R^8$ is independently hydrogen atom, an alkyl group having 1 to 6 carbon atoms or an alkanol group having 1 to 6 carbon atoms; and $R^6$ is a linear, branched or cyclic alkylene group having 1 to 18 carbon atoms, or a group represented by Formula (III):

wherein each of $R^9$ and $R^{10}$ is independently hydrogen atom or an alkyl group having 1 to 6 carbon atoms; and each of a and b is an integer of from 0 to 9, with proviso that a total number of carbon atoms in Formula (III) is from 2 to 18;

(C) a monoamine compound represented by Formula (IV):

wherein each of $R^{11}$, $R^{12}$ and $R^{13}$ is independently hydrogen atom, an alkyl group having 1 to 8 carbon atoms, an alkanol group having 1 to 8 carbon atoms, an alkanediol group having 1 to 8 carbon atoms, an alkanetriol group having 1 to 8 carbon atoms or a group represented by $-(R^{14}O)_cR^{15}$; $R^{14}$ is an alkylene group having 1 to 4 carbon atoms; $R^{15}$ is hydrogen atom, an alkyl group having 1 to 18 carbon atoms or an acyl group having 1 to 18 carbon atoms; and c is an integer of from 1 to 20, with proviso that:

(i) at least one of $R^{11}$, $R^{12}$ and $R^{13}$ is an alkanediol group having 1 to 8 carbon atoms, an alkanetriol group having 1 to 8 carbon atoms or a group represented by —$(R^4O)_cR^{35}$, wherein $R^{35}$ is an alkyl group having 1 to 18 carbon atoms or an acyl group having 1 to 18 carbon atoms; or (ii) in a case where at least one of $R^{11}$, $R^{12}$ and $R^{13}$ is an alkanol group having 1 to 8 carbon atoms or a group represented by —$(R^{14}O)_cH$, at least one of the other groups is an alkyl group having 1 to 8 carbon atoms;

(D) a polyamine having three or more amino groups in its molecule;

(E) an ether group-containing amine; and (F) a heterocyclic compound having nitrogen atom.

In Formula (I), each of $R^1$, $R^2$ and $R^3$ is hydrogen atom, an alkyl group having 1 to 6 carbon atoms, or an alkenyl group having 2 to 6 carbon atoms. Each of $R^1$, $R^2$ and $R^3$ is an alkyl group having preferably 1 to 4 carbon atoms, more preferably 1 to 3 carbon atoms, from the viewpoint of increase in the selective ratio. In addition, the total number of carbon atoms in $R^1$, $R^2$ and $R^3$ is preferably from 1 to 6, more preferably from 1 to 4, still more preferably from 1 to 3, from the viewpoint of the increase in the selective ratio. In addition, primary amines and secondary amines are preferable, and the primary amines are more preferable, from the viewpoint of the increase in the selective ratio. Further, the alkyl groups may have a linear structure, a branched structure or a cyclic structure, and a linear structure or a branched structure is preferable.

Concrete examples of the monoamine compound represented by Formula (I) include methylamine, ethylamine, propylamine, isopropylamine, butylamine, isobutylamine, sec-butylamine, pentylamine, hexylamine, dimethylamine, diethylamine, dipropylamine, diisopropylamine, methylethylamine, trimethylamine, triethylamine, allylamine, diallylamine, N,N-dimethylallylamine, N-methyldiallylamine, cyclopropylamine, cyclobutylamine, cyclopentylamine, cyclohexylamine, and the like. Methylamine, ethylamine, propylamine, isopropylamine, dimethylamine, diethylamine, dipropylamine and diisopropylamine are preferable, from the viewpoint of the increase in the selective ratio. Particularly preferable are propylamine and isopropylamine. These amine compounds may be used alone or in admixture of two or more kinds.

In Formula (II), each of $R^4$, $R^5$, $R^7$ and $R^8$ is hydrogen atom, an alkyl group having 1 to 6 carbon atoms or an alkanol group having 1 to 6 carbon atoms. Each of $R^4$, $R^5$, $R^7$ and $R^8$ is preferably hydrogen atom, an alkyl group having 1 to 4 carbon atoms or an alkanol group having 1 to 4 carbon atoms, more preferably hydrogen atom, an alkyl group having 1 to 3 carbon atoms or an alkanol group having 1 to 3 carbon atoms, wherein the alkyl group or the alkanol group may have a linear structure or a branched structure, from the viewpoint of the solubility in water and the viewpoint of the increase in the selective ratio. In addition, $R^6$ is a linear, branched or cyclic alkylene group having 1 to 18 carbon atoms, or a group represented by Formula (III). Among them, the group represented by Formula (III) is preferable, from the viewpoint of the increase in the selective ratio.

Each of $R^9$ and $R^{10}$ is hydrogen atom or an alkyl group having 1 to 6 carbon atoms. Each of $R^9$ and $R^{10}$ is preferably hydrogen atom or an alkyl group having 1 to 4 carbon atoms, more preferably hydrogen atom or an alkyl group having 1 to 3 carbon atoms, from the viewpoint of the solubility in water and the viewpoint of the increase in the selective ratio. In addition, each of a and b is an integer of from 0 to 9. Each of a and b is an integer of preferably from 0 to 8, more preferably from 0 to 5, especially preferably from 0 to 3, from the viewpoint of the solubility in water and the viewpoint of the increase in the selective ratio. In addition, a+b is preferably from 1 to 11, more preferably from 1 to 9, still more preferably from 1 to 7, especially preferably from 1 to 5. Further, the total number of carbon atoms in Formula (III) is from 2 to 18, preferably from 2 to 16, more preferably from 2 to 12, especially preferably from 2 to 10, from the viewpoint of the increase in the selective ratio.

Concrete examples of the diamine compound represented by Formula (II) include ethylenediamine, 1,2-diaminopropane, 1,3-propanediamine, 1,4-butanediamine, N,N-dimethylethylenediamine, N,N'-dimethylethylenediamine, N-ethylethylenediamine, N-methyl-1,3-propanediamine, pentamethylenediamine, 1,3-diaminopentane, N-isopropylethylenediamine, hexamethylenediamine, N-isopropyl-1,3-propanediamine, N,N,N',N'-tetramethylethylenediamine, heptamethylenediamine, N,N,N',N'-tetramethyl-1,2-propanediamine, N,N,N',N'-tetramethyl-1,3-propanediamine, N,N,2,2-tetramethyl-1,3-propanediamine, octamethylenediamine, N,N'-dimethyl-1,6-diaminohexane, N,N,N',N'-tetramethyl-1,4-butanediamine, nonamethylenediamine, N,N,N',N'-tetramethyl-2,2-dimethyl-1,3-propanediamine, decamethylenediamine, N,N,N',N'-tetramethyl-1,6-diaminohexane, undecamethylenediamine, 3-(dibutylamino)propylamine, dodecamethylenediamine, cyclohexanediamine, 2-hydroxyethylaminopropylamine, diethanolaminopropylamine, and the like.

Among them, ethylenediamine, 1,2-diaminopropane, 1,3-propanediamine, 1,4-butanediamine, hexamethylenediamine and N,N,N',N'-tetramethyl-1,6-diaminohexane are preferable, from the viewpoint of the solubility in water and the viewpoint of the increase in the selective ratio. N,N,N',N'-tetramethyl-1,6-diaminohexane are especially preferable. These amine compounds may be used alone or in admixture of two or more kinds.

In Formula (IV), each of $R^{11}$, $R^{12}$ and $R^{13}$ is hydrogen atom, an alkyl group having 1 to 8 carbon atoms, an alkanol group having 1 to 8 carbon atoms, an alkanediol group having 1 to 8 carbon atoms, an alkanetriol group having 1 to 8 carbon atoms or a group represented by —$(R^{14}O)_cR^{15}$. Here, $R^{14}$ is an alkylene group having 1 to 4 carbon atoms. $R^{14}$ is an alkylene group having preferably 2 or 3 carbon atoms, from the viewpoint of the solubility in water. $R^{15}$ is hydrogen atom, an alkyl group having 1 to 18 carbon atoms or an acyl group having 1 to 18 carbon atoms. $R^{15}$ is preferably hydrogen atom or an alkyl group having 1 to 12 carbon atoms, more preferably hydrogen atom or an alkyl group having 1 to 6 carbon atoms, still more preferably hydrogen atom or an alkyl group having 1 to 4 carbon atoms, from the viewpoints of the increase in the selective ratio and the stability. In addition, c is an integer of from 1 to 20. c is an integer of preferably from 1 to 10, more preferably from 1 to 8, especially preferably from 1 to 5, from the viewpoint of the increase in the selective ratio. In addition, as to the number of carbon atoms in the alkyl group, the alkanol group, the alkanediol group or the alkanetriol group for $R^{11}$ to $R^{13}$, the number of carbon atoms in the alkyl group is preferably from 1 to 6, more preferably from 1 to 4, especially preferably from 1 to 3, from the viewpoint of the increase in the selective ratio. The alkyl chain may have a linear structure or a branched structure. In addition, the number of carbon atoms in each of the alkanol group, the alkanediol group or the alkanetriol group is preferably from 2 to 8, more preferably from 3 to 6. Here, at least one of $R^{11}$, $R^{12}$ and $R^{13}$ is an alkanediol group having 1 to 8 carbon atoms, an alkanetriol group having 1 to 8 carbon atoms or a group represented by —$(R^{14}O)_c R^{35}$, wherein $R^{35}$ is an alkyl group having 1 to 18 carbon atoms or an acyl group having 1 to 18 carbon atoms. Alternatively, in a case where at least one of $R^{11}$, $R^{12}$ and $R^{13}$ is an alkanol group having 1 to 8 carbon atoms or a group represented by —$(R^{14}O)_c H$, at least one of the other groups is an alkyl group having 1 to 8 carbon atoms. In the case where two of $R^{11}$, $R^{12}$ and $R^{13}$ are a group represented by —$(R^{14}O)_c R^{15}$, each of $R^{14}$, $R^{15}$ and c in each group may be identical or different.

Concrete examples of the monoamine compound represented by Formula (IV) include 2-(methylamino)ethanol, N-ethyldiethanolamine, 3-(methylamino)propanol, N-methyldipropanolamine, 2-(ethylamino)ethanol, 2-(dimethylamino)ethanol, 4-(methylamino)dibutanol, 2-isopropylamino)ethanol, 1-(dimethylamino)-2-propanol, 4-(dimethylamino)-1-butanol, 4-(ethylamino)-1-butanol, 3-(diethylamino)-1-propanol, 1-(diethylamino)-2-propanol, 6-(dimethylamino)-1-hexanol, 2-(diisopropylamino) ethanol, 2-(dibutylamino)ethanol, N,N-dimethylethoxyethanolamine, N,N-dimethylethoxyethoxyethanolamine, N,N-diethylethoxyethanolamine, N,N-diethylethoxyethoxyethanolamine, 2-amino-1,3-propanediol, 3-amino-1,2-propanediol, 2-amino-2-methyl-1,3-propanediol, 2-amino-2-ethyl-1,3-propanediol, 3-diethylamino-1,2-propanediol, 3-dimethylamino-1,2-propanediol, 3-methylamino-1,2-propanediol, tris (hydroxymethyl)aminomethane, ethoxypropylamine, 3-methoxypropylamine, 2-methoxyethylamine, 3-propoxypropylamine, 3-isobutoxypropylamine, bis(2-methoxyethyl)amine and the like. Among them, 6-(dimethylamino)-1-hexanol is especially preferable, from the viewpoint of the increase in the selective ratio. These amine compounds may be used alone or in admixture of two or more kinds.

The polyamine having three or more amino groups in its molecule includes a compound represented by Formula (V):

wherein each of $R^{16}$, $R^{17}$, $R^{21}$, $R^{23}$ and $R^{24}$ is independently hydrogen atom or an alkyl group having 1 to 6 carbon atoms; each of $R^{18}$, $R^{20}$ and $R^{22}$ is independently an alkylene group having 1 to 18 carbon atoms; and $R^{19}$ is hydrogen atom, an alkyl group having 1 to 6 carbon atoms or a group represented by Formula (VI):

wherein $R^{25}$ is an alkylene group having 1 to 18 carbon atoms; and each of $R^{26}$ and $R^{27}$ is independently hydrogen atom or an alkyl group having 1 to 6 carbon atoms; and d is an integer of from 0 to 20, and an amino group-containing polymer compound.

Here, each of $R^{16}$, $R^{17}$, $R^{21}$, $R^{23}$, $R^{24}$, $R^{26}$ and $R^{27}$ is hydrogen atom or an alkyl group having 1 to 6 carbon atoms. Each of $R^{16}$, $R^{17}$, $R^{21}$, $R^{23}$, $R^{24}$, $R^{26}$ and $R^{27}$ is preferably hydrogen atom or an alkyl group having 1 to 3 carbon atoms, from the viewpoint of the increase in the selective ratio. In addition, each of $R^{18}$, $R^{20}$, $R^{22}$ and $R^{25}$ is an alkylene group having 1 to 18 carbon atoms. Each of $R^{18}$, $R^{20}$, $R^{22}$ and $R^{25}$ is an alkylene group having preferably 2 to 12 carbon atoms, more preferably 2 to 6 carbon atoms, from the viewpoint of the increase in the selective ratio. In addition, d is an integer of from 0 to 20. d is preferably from 0 to 6, more preferably from 0 to 4, still more preferably from 0 to 1, from the viewpoint of the increase in the selective ratio. Incidentally, in a case where d is 2 or more, plural $R^{20}$ and plural $R^{21}$ groups may respectively be identical to or different from each other.

Concrete examples of the polyamine having three or more amino groups in its molecule include diethylenetriamine, bis(3-aminopropyl)amine, N-methyl-3,3'-iminobis (propylamine), bis(hexamethylene)triamine, spermidine, spermine, triethylenetetramine, N,N'-bis(2-aminopropyl) ethylenediamine, N,N'-bis(2-aminoethyl)-1,3-propanediamine, N,N'-bis(3-aminopropyl)-1,3-propanediamine, tris(2-aminoethyl)amine, N,N,N',N',N''-pentamethyldiethylenetriamine, tetraethylenepentamine, polyethyleneimine, polyvinylamine, and the like. Among them, bis(3-aminopropyl)amine and triethylenetetramine are preferable, from the viewpoint of the increase in the selective ratio. These polyamines having three or more amino groups in their molecules may be used alone or in admixture of two or more kinds.

The ether group-containing amine includes a compound represented by Formula (VII):

wherein each of $R^{28}$, $R^{29}$, $R^{33}$ and $R^{34}$ is independently hydrogen atom or an alkyl group having 1 to 6 carbon atoms; each of $R^{30}$ and $R^{32}$ is independently an alkylene group having 1 to 18 carbon atoms; $R^{31}$ is an alkylene group having 1 to 4 carbon atoms; and e is an integer of from 0 to 20.

Here, each of $R^{28}$, $R^{29}$, $R^{33}$ and $R^{34}$ is hydrogen atom or an alkyl group having 1 to 6 carbon atoms. Each of $R^{28}$, $R^{29}$, $R^{33}$ and $R^{34}$ is preferably hydrogen atom or an alkyl group having 1 to 3 carbon atoms, from the viewpoint of the increase in the selective ratio. Each of $R^{30}$ and $R^{32}$ is an alkylene group having 1 to 18 carbon atoms. Each of $R^{30}$ and $R^{32}$ is an alkylene group having preferably 2 to 12 carbon atoms, more preferably 2 to 6 carbon atoms, from the viewpoint of the increase in the selective ratio. In addition, e is an integer of from 0 to 20. e is preferably from 0 to 10, more preferably from 0 to 8, still more preferably from 0 to 5, from the viewpoint of the increase in the selective ratio. In the case where e is 2 or more, plural $R^{30}$ may be identical to or different with each other.

Concrete examples of the ether group-containing amine include bis(3-aminopropyl) ether, dimethylaminoethoxypropylamine, 1,2-bis(2-aminoethoxy) ethane, 1,2-bis(3-aminopropoxy)ethane, 4,9-dioxa-1,12-dodecanediamine, diethylene glycol bis(3-aminopropyl) ether, and the like. Among them, diethylene glycol bis(3- aminopropyl) ether is preferable, from the viewpoint of the increase in the selective ratio. These ether group-containing amines may be used alone or in admixture of two or more kinds.

Various compounds may be used as the heterocyclic compound having nitrogen atom, and heterocyclic compounds in which one or more nitrogen atoms constituting the heterocyclic ring are secondary amines are preferable, from the viewpoint of the increase in the selective ratio.

Concrete examples of the heterocyclic compound having nitrogen atom include piperidine, piperazine, homopiperazine, pyrrolidine, pyridine, pyrazine, pyrrole, triethylenediamine, morpholine, 2-aminopyridine, 3-aminopyridine, 4-aminopyridine, 3-amino-1,2,4-triazole, N-(3-aminopropyl)morpholine, N-(2-aminoethyl) morpholine, N-aminoethylpiperidine, N-aminopropylpiperidine, 1-amino-4-methylpiperazine, 2-methylimidazole, 4-methylimidazole, 1,3-di(4-piperidyl) propane, 2,6-dimethylpiperazine, 2,5-dimethylpiperazine, 3,5-dimethylpyrazole, bis(3-aminopropyl)piperazine, aminoethylpiperazine, hydroxyethylpiperazine, pipecoline, 2-(1-piperazinyl)pyrimidine, 4-piperidinopyridine, pyridinemethanol, N-methylpiperazine, 2-methylpiperazine, N-methylpiperidine, 3-piperidinemethanol, 4-hydroxypiperidine, and the like. Among them, piperazine and piperidine are preferable, from the viewpoint of the increase in the selective ratio. These heterocyclic compounds having nitrogen atom may be used alone or in admixture of two or more kinds.

Further, the monoamine compound represented by Formula (I), the diamine compound represented by Formula (II), the monoamine compound represented by Formula (IV), the polyamine having three or more amino groups in its molecule, the ether group-containing amine and the heterocyclic compounds having nitrogen atom may be used in admixture of two or more kinds.

In the present invention, by using the above-mentioned improver of a selective ratio in a polishing composition, there is exhibited an excellent effect that the selective ratio of a polishing rate of an insulating film to that of a stopper film can be increased stably and in a low cost in the polishing according to the STI method. The reason why the above-mentioned effect is exhibited is presumably due to the fact that the above-mentioned improver of a selective ratio is selectively adsorbed on the stopper film surface, thereby controlling the polishing rate of the stopper film.

Accordingly, the present invention provides a process for selectively increasing a selective ratio of a polishing rate of an insulating film to that of a stopper film using the above-mentioned improver of a selective ratio.

The polishing composition of the present invention comprises the above-mentioned improver of a selective ratio. The amount of the improver of a selective ratio is preferably from 0.01 to 20% by weight, more preferably from 0.1 to 15% by weight, still more preferably from 0.3 to 10% by weight, most preferably from 0.5 to 5% by weight, of the entire amount of the polishing composition, from the viewpoint of selectively controlling the polishing rate of the stopper film without drastically reducing the polishing rate of the insulating film and the viewpoint of the surface properties of the substrate after polishing.

It is preferable that the polishing composition of the present invention further comprises a pH adjusting agent and/or an abrasive.

The pH of the polishing composition is preferably from 8 to 13, more preferably from 10 to 13, from the viewpoint of showing a high polishing rate of the insulating film. A pH adjusting agent is used in order to adjust the pH in such a manner.

As the pH adjusting agent, an alkaline source such as ammonia (concretely an aqueous ammonia), potassium hydroxide or an amine can be appropriately used. Incidentally, since the above-mentioned improver of a selective ratio has a pH adjusting ability, when this improver of a selective ratio is used, the use of the above-mentioned alkali source can be omitted, or the amount of the alkali source used can be reduced. In addition, the content of the pH adjusting agent is preferably from 0.001 to 5% by weight, more preferably from 0.01 to 3% by weight, still more preferably from 0.1 to 1% by weight, of the entire amount of the polishing composition, from the viewpoint of the increase in the selective ratio.

As the abrasive used in the present invention, any abrasives generally employed for polishing can be used. Examples of the abrasive include metals: carbides of metals or metalloids, nitrides of metals or metalloids, oxides of metals or metalloids, borides of metals or metalloids; diamond, and the like. The metals or metalloids include those elements belonging to the Groups 2A, 2B, 3A, 3B, 4A, 4B, 5A, 6A, 7A or 8 of the Periodic Table (long period form). Concrete examples of the abrasive include α-alumina particles, silicon carbide particles, diamond particles, magnesium oxide particles, zinc oxide particles, cerium oxide particles, zirconium oxide particles, colloidal silica particles, fumed silica particles, and the like. Among them, silica is preferable, from the viewpoints of giving excellent dispersibility of the abrasive and surface properties of the substrate after polishing. More preferable are the colloidal silica prepared by a process using an alkali silicate or an alkoxysilane as a starting raw material; and fumed silica prepared by high-temperature hydrolysis of a volatile silicon compound such as silicon tetrachloride in oxyhydrogen flame. The average particle size of the abrasive, as calculated from the specific surface area determined by the BET method, is preferably from 1 to 1000 nm, more preferably from 5 to 500 nm, still more preferably from 10 to 300 nm, from the viewpoint of increasing the polishing rate. The amount of the abrasive is preferably from 0.5 to 30% by weight, more preferably from 1 to 25% by weight, still more preferably from 3 to 15% by weight, of the entire amount of the polishing composition, from the viewpoint of increasing the polishing rate.

The polishing composition of the present invention, which comprises the improver of a selective ratio, or the improver of a selective ratio and a pH adjusting agent, is effective for a polishing process using a fixed grinding wheel, a polishing pad in which the abrasive grains are fixed in the pad, and the like. Further, the polishing composition comprising the above-mentioned abrasive is effective for a polishing process employing loose abrasives using a polishing pad made of polyurethane, and the polishing composition is also effective for a polishing process using a fixed grinding wheel, a polishing pad in which the abrasive grains are fixed in the pad, and the like.

The balance of the polishing composition of the present invention is water. The water content is preferably from 45 to 99.49% by weight, more preferably from 55 to 99% by weight, still more preferably from 65 to 95% by weight, of the entire amount of the polishing composition, from the viewpoint of the increase in the selective ratio.

In addition, the polishing composition of the present invention can optionally comprise other component including a disinfectant and an antibacterial agent, such as tetramethylammonium chloride, tetraethylammonium chloride, tetramethylammonium hydroxide, tetraethylammonium hydroxide, benzalkonium chloride, and benzethonium chloride.

The concentration of each of the components in the above-mentioned polishing composition is a preferable concentration during polishing, and the concentration may be that at the time the composition is prepared. The polishing composition may be prepared as a concentrate, and used by dilution upon use.

By using the polishing composition of the present invention having the above-mentioned constitution, there is exhibited an excellent effect that a substrate to be polished having an extremely small difference between the level of a silicon substrate surface after removing the stopper film and the level of the insulating film surface on the trench part can be obtained stably and at a low cost, in the polishing according to the STI method.

The polishing composition of the present invention is suitably used in, for instance, the STI method comprising removing an insulating film which has been embedded for isolation into a trench formed on a silicon substrate and sedimented outside the trench, thereby planing a surface of the silicon substrate.

In addition, the process for producing a substrate to be polished of the present invention is carried out by using the polishing composition of the present invention. Here, by polishing with the polishing composition comprising the improver of a selective ratio of the present invention, the selective ratio of a polishing rate of an insulating film to that of a stopper film is increased, so that an excellent planarization can be carried out. In addition, the thickness of the stopper film such as a silicon nitride film can be reduced without causing a defect such as thinning in a substrate to be polished due to the planarization, so that high integration of semiconductors can be attained.

The substrate to be polished used in the present invention is a substrate which is obtained by an isolation step comprising embedding an insulating film in a trench formed on a silicon substrate, such as the STI method. The substrate to be polished comprises an insulating film, which is an object to be polished, and a stopper film for controlling the progress of polishing.

The insulating film used in the present invention is preferably a silicon oxide film, among which a plasma TEOS film, an atmospheric CVD film, a thermal oxidation film and the like can be used. On the other hand, the stopper film is preferably a silicon nitride film, among which a low pressure CVD film, an atmospheric CVD film and the like can be used. The properties, such as thickness, of the insulating film and the stopper film are not particularly limited.

In the process for producing a substrate to be polished of the present invention, in order to remove an excess insulating film formed on the silicon substrate during an isolation step comprising embedding an insulating film in a trench formed on a silicon substrate, such as the STI method, a planed, substrate to be polished can be efficiently prepared by polishing with the polishing composition comprising the improver of a selective ratio.

EXAMPLES

The expression "% by weight" in Examples is made on the basis of the entire weight of the polishing composition. As the polishing device, a single-sided polishing machine (product number: MA-300, manufactured by Engis Corporation) was used. The polishing conditions are given below.

1) Polishing Conditions

In Examples, as a substrate to be polished, there were used a silicon substrate (4 cm in length×4 cm in width) obtained by vapor deposition of a silicon oxide film (oxide film serving as an insulating film) on the substrate surface in a thickness of 10000 Å (1000 nm) by means of plasma TEOS, and a silicon substrate (4 cm in length×4 cm in width) obtained by vapor deposition of a silicon nitride film (nitride film serving as a stopper film) on the substrate surface in a thickness of 3000 Å (300 nm) by means of low pressure CVD.

Figure 1:
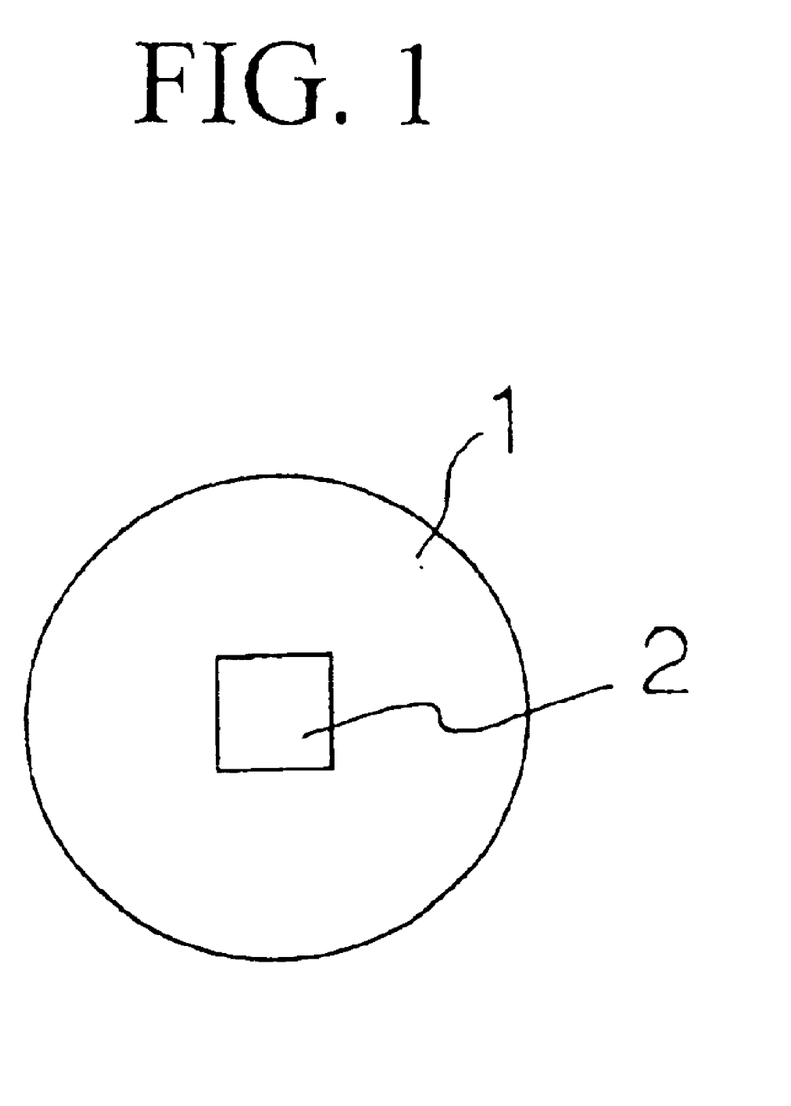
FIG. 1 is a schematic view showing a carrier surface used in Examples.

As the polishing pad, there was used IC1400(P) having an outer diameter of 30 cmφ, manufactured by Rodel Nitta K.K. Also, the polishing pressure was $2.5 \times 10^4$ Pa, the flow rate of the polishing agent was 50 mL/min. The disc rotational speed was 80 rpm, and the number of rotations for polishing head was 60 rpm, wherein the disc and the head were rotated in the same rotation. The polishing time was 3 minutes. Further, a water-sticking backing film was pasted on a supporting platform made of a ceramic used for a polishing head, and a carrier 1 made of a glass epoxy resin was pasted thereon. A substrate to be polished 2 was adhered to the carrier 1 (see FIG. 1).

2) Calculation of Polishing Rate

The polishing rate was determined by carrying out polishing under the conditions mentioned above, determining an average value of the change in the polishing film thickness of each substrate to be polished before and after polishing, and dividing the resulting average value by the polishing time. The amount of change in the film thickness was calculated by obtaining a film thickness from an ellipsometer (MARY-102LD, manufactured by Five Lab K.K.).

3) Calculation of Selective Ratio of Polishing Rate

The selective ratio of a polishing rate was calculated by dividing the polishing rate of the oxide film by the polishing rate of the nitride film.

Examples 1 to 11 and
Comparative Examples 1 to 5

A commercially available silica polishing agent (trade name "Semi Sperse 25," manufactured by Cabot Corporation, containing potassium hydroxide as a pH adjusting agent) was well shaken before use. After having confirmed that there was no sedimentation of the abrasive, 15 g of propylamine was added to 260 g of the polishing agent, and ion-exchanged water was added to the mixture to make up a total volume of 500 g (propylamine concentration: 3% by weight), to give a polishing composition of Example 1. After stirring the polishing composition, each of the oxide film and the nitride film was polished under the above-mentioned polishing conditions. The polishing compositions of Examples 3 to 11 and Comparative Examples 1 to 5 were obtained by the same procedures as in Example 1, except for using the improver of a selection ratio and the pH adjusting agent shown in Table 1. Then, the same polishing procedures as in Example 1 were carried out for Examples 3 to 11 and Comparative Examples 1 to 5. As to Example 2, a commercially available silica polishing agent ILD1300 (trade name, manufactured by Rodel Nitta K.K.) was well shaken before use; having confirming that there was no sedimentation of silica therein, 5 g (concentration: 1% by weight) of ethylenediamine was added to 495 g of the polishing agent, to give a polishing composition. After stirring, each of the oxide film and the nitride film was polished under the above-mentioned polishing conditions. The results are shown in Table 1.

TABLE 1

| No. | Improver of Selective Ratio Kind | Content (% by wt) | Classification of Improver of Selective Ratio | Polishing Rate (nm/minute) Oxide Film | Polishing Rate (nm/minute) Nitride Film | Selective Ratio of Polishing Rates | pH Adjusting Agent | pH |
|---|---|---|---|---|---|---|---|---|
| Ex. 1 | Propylamine | 3.0 | Formula (I) | 204 | 13 | 16.0 | Potassium Hydroxide | 12.0 |
| Ex. 2 | Ethylenediamine | 1.0 | Formula (II) | 420 | 60 | 7.0 | Ammonia | 12.0 |
| Ex. 3 | Isopropylamine | 3.0 | Formula (I) | 206 | 12 | 17.2 | Potassium Hydroxide | 12.0 |
| Ex. 4 | Diethylamine | 3.0 | Formula (I) | 160 | 30 | 5.3 | Potassium Hydroxide | 12.0 |
| Ex. 5 | Dipropylamine | 3.0 | Formula (I) | 208 | 30 | 6.9 | Potassium Hydroxide | 12.0 |
| Ex. 6 | KL-1[1] | 1.0 | Formula (II) | 120 | 2 | 60.0 | Potassium Hydroxide | 12.0 |
| Ex. 7 | KL-25[2] | 5.0 | Formula (IV) | 196 | 8 | 24.5 | Potassium Hydroxide | 12.0 |
| Ex. 8 | Bis(3-aminopropyl)-amine | 2.0 | Formula (V) | 154 | 18 | 8.4 | Potassium Hydroxide | 12.0 |
| Ex. 9 | Triethylenetetramine | 2.0 | Formula (V) | 163 | 13 | 13.0 | Potassium Hydroxide | 12.0 |
| Ex. 10 | Diethylene glycol bis(3-aminopropyl) Ether | 3.0 | Formula (VII) | 178 | 6 | 32.0 | Potassium Hydroxide | 12.0 |
| Ex. 11 | Piperazine | 5.0 | Heterocyclic Compound | 199 | 7 | 29.6 | Potassium Hydroxide | 12.0 |
| Comp. Ex. 1 | — | — | — | 200 | 50 | 4.0 | Potassium Hydroxide | 11.0 |
| Comp. Ex. 2 | Triethanolamine | 1.0 | — | 140 | 46 | 3.0 | Potassium Hydroxide | 12.0 |
| Comp. Ex. 3 | Triethanolamine | 3.0 | — | 124 | 45 | 2.8 | Potassium Hydroxide | 12.0 |
| Comp. Ex. 4 | Triethanolamine | 5.0 | — | 110 | 46 | 2.4 | Potassium Hydroxide | 12.0 |
| Comp. Ex. 5 | TMAH[3] | 3.0 | — | 40 | 10 | 4.0 | Potassium Hydroxide | 12.0 |

[1] Kaolizer No. 1 (trade name, manufactured by Kao Corporation, N,N,N',N'-tetramethyl-1,6-diaminohexane)
[2] Kaolizer No. 25 (trade name, manufactured by Kao Corporation, 6-(dimethylamino)-1-hexanol)
[3] TMAH: tetramethylammonium hydroxide It can be seen from the results shown in Table 1 that the polishing compositions of Examples 1 to 11 each comprising the improver of a selective ratio of the present invention have markedly increased selective ratios of polishing rates, as compared to the polishing compositions of Comparative Examples 1 to 5.

By using the polishing composition comprising the improver of a selective ratio of a polishing rate of an insulating film to that of a stopper film of the present invention, the ratio of a polishing rate of an insulating film to that of a stopper film can be increased.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for selectively increasing a ratio of a polishing rate of an insulating film to that of a stopper film, wherein the insulating film and the stopper film are included in a substrate, said process comprising applying to the substrate a polishing composition having a pH of from 10 to 13, wherein the polishing composition comprises at least one compound selected from the group consisting of:

(A) a monoamine compound represented by Formula (I):

(I)

wherein each of $R^1$, $R^2$ and $R^3$ is independently selected from the group consisting of hydrogen atom, an alkyl group having 1 to 6 carbon atoms and an alkenyl group having 2 to 6 carbon atoms, with proviso that a total number of carbon atoms in $R^1$, $R^2$ and $R^3$ is from 1 to 8;

(B) a diamine compound represented by Formula (II):

(II)

wherein each of $R^4$, $R^5$, $R^7$ and $R^8$ is independently selected from the group consisting of hydrogen atom, an alkyl group having 1 to 6 carbon atoms and an alkanol group having 1 to 6 carbon atoms; and $R^6$ is selected from the group consisting of a linear alkylene group having 1 to 18 carbon atoms, a branched alkylene group having 1 to 18 carbon atoms, a cyclic alkylene group having 1 to 18 carbon atoms, and a group represented by Formula (III):

(III)

wherein each of $R^9$ and $R^{10}$ is independently selected from the group consisting of hydrogen atom and an alkyl group having 1 to 6 carbon atoms; and each of a and b is an integer of from 0 to 9, with proviso that a total number of carbon atoms in Formula (III) is from 2 to 18;

(C) a monoamine compound represented by Formula (IV):

wherein each of $R^{11}$, $R^{12}$ and $R^{13}$ is independently selected from the group consisting of hydrogen atom, an alkyl group having 1 to 8 carbon atoms, an alkanol group having 1 to 8 carbon atoms, an alkanediol group having 1 to 8 carbon atoms, an alkanetriol group having 1 to 8 carbon atoms and a group represented by —$(R^{14}O)_cR^{15}$; $R^{14}$ is an alkylene group having 1 to 4 carbon atoms; $R^{15}$ is selected from the group consisting of hydrogen atom, an alkyl group having 1 to 18 carbon atoms and an acyl group having 1 to 18 carbon atoms; and c is an integer of from 1 to 20, with proviso that:

(i) at least one of $R^{11}$, $R^{12}$ and $R^{13}$ is selected from the group consisting of an alkanediol group having 1 to 8 carbon atoms, an alkanetriol group having 1 to 8 carbon atoms and a group represented by —$(R^{14}O)_cR^{35}$, wherein $R^{35}$ is selected from the group consisting of an alkyl group having 1 to 18 carbon atoms and an acyl group having 1 to 18 carbon atoms; and (ii) in a case where at least one of $R^{11}$, $R^{12}$ and $R^{13}$ is selected from the group consisting of an alkanol group having 1 to 8 carbon atoms and a group represented by —$(R^{14}O)_cH$, at least one of the other groups is an alkyl group having 1 to 8 carbon atoms;

(D) a polyamine having at least three amino groups in its molecule;

(E) an ether group-containing amine; and (F) a heterocyclic compound having nitrogen atom.

2. A process for producing a substrate to be polished, wherein the substrate comprises an insulating film and a stopper film, said process comprising applying to the substrate a polishing composition comprising at least one compound selected from the group consisting of:

(A) a monoamine compound represented by Formula (I):

wherein each of $R^1$, $R^2$ and $R^3$ is independently selected from the group consisting of hydrogen atom, an alkyl group having 1 to 6 carbon atoms and an alkenyl group having 2 to 6 carbon atoms, with proviso that a total number of carbon atoms in $R^1$, $R^2$ and $R^3$ is from 1 to 8;

(B) a diamine compound represented by Formula (II):

wherein each of $R^4$, $R^5$, $R^7$ and $R^8$ is independently selected from the group consisting of hydrogen atom, an alkyl group having 1 to 6 carbon atoms and an alkanol group having 1 to 6 carbon atoms; and $R^6$ is selected from a group consisting of a linear alkylene group having 1 to 18 carbon atoms, a branched alkylene group having 1 to 18 carbon atoms, a cyclic alkylene group having 1 to 18 carbon atoms, and a group represented by Formula (III):

wherein each of $R^9$ and $R^{10}$ is independently selected from the group consisting of hydrogen atom and an alkyl group having 1 to 6 carbon atoms; and each of a and b is an integer of from 0 to 9, with proviso that a total number of carbon atoms in Formula (III) is from 2 to 18;

(C) a monoamine compound represented by Formula (IV):

wherein each of $R^{11}$, $R^{12}$ and $R^{13}$ is independently selected from the group consisting of hydrogen atom, an alkyl group having 1 to 8 carbon atoms, an alkanol group having 1 to 8 carbon atoms, an alkanediol group having 1 to 8 carbon atoms, an alkanetriol group having 1 to 8 carbon atoms and a group represented by —$(R^{14}O)_cR^{15}$; $R^{14}$ is an alkylene group having 1 to 4 carbon atoms; $R^{15}$ is selected from the group consisting of hydrogen atom, an alkyl group having 1 to 18 carbon atoms and an acyl group having 1 to 18 carbon atoms; and c is an integer of from 1 to 20, with proviso that:

(i) at least one of $R^{11}$, $R^{12}$ and $R^{13}$ is selected from the group consisting of an alkanediol group having 1 to 8 carbon atoms, an alkanetriol group having 1 to 8 carbon atoms and a group represented by —$(R^{14}O)_cR^{35}$, wherein $R^{35}$ is selected from the group consisting of an alkyl group having 1 to 18 carbon atoms and an acyl group having 1 to 18 carbon atoms; and (ii) in a case where at least one of $R^{11}$, $R^{12}$ and $R^{13}$ is selected from the group consisting of an alkanol group having 1 to 8 carbon atoms and a group represented by —$(R^{14}O)_cH$, at least one of the other groups is an alkyl group having 1 to 8 carbon atoms;

(D) a polyamine having at least three amino groups in its molecule;

(E) an ether group-containing amine; and (F) a heterocyclic compound having nitrogen atom, whereby a polishing rate of the stopper film is selectively decreased.

3. The process according to claim 2, wherein the polishing composition further comprises an abrasive, a pH adjusting agent, or a mixture thereof.

4. The process according to claim 3, wherein the polishing composition is used for removing a sedimented moiety of an insulating film outside a trench formed on a silicon substrate, the insulating film having been embedded for isolation into the trench, thereby planing a surface of the silicon substrate.

5. The process according to claim 2, wherein the polishing composition is used for removing a sedimented moiety of an insulating film outside a trench formed on a silicon substrate, the insulating film having been embedded for isolation into the trench, thereby planing a surface of the silicon substrate.

6. A polishing process comprising removing a sedimented moiety of an insulating film outside a trench formed on a silicon substrate, the insulating film having been embedded for isolation into the trench with a polishing composition, thereby planing a surface of the silicon substrate, wherein the polishing composition comprises at least one compound selected from the group consisting of:

(A) a monoamine compound represented by Formula (I):

(I)

wherein each of $R^1$, $R^2$ and $R^3$ is independently selected from the group consisting of hydrogen atom, an alkyl group having 1 to 6 carbon atoms and an alkenyl group having 2 to 6 carbon atoms, with proviso that a total number of carbon atoms in $R^1$, $R^2$ and $R^3$ is from 1 to 8;

(B) a diamine compound represented by Formula (II):

(II)

wherein each of $R^4$, $R^5$, $R^7$ and $R^8$ is independently selected from the group consisting of hydrogen atom, an alkyl group having 1 to 6 carbon atoms and an alkanol group having 1 to 6 carbon atoms; and $R^6$ is selected from the group consisting of a linear alkylene group having 1 to 18 carbon atoms, a branched alkylene group having 1 to 18 carbon atoms, a cyclic alkylene group having 1 to 18 carbon atoms, and a group represented by Formula (III):

(III)

wherein each of $R^9$ and $R^{10}$ is independently selected from the group consisting of hydrogen atom and an alkyl group having 1 to 6 carbon atoms; and each of a and b is an integer of from 0 to 9, with proviso that a total number of carbon atoms in Formula (III) is from 2 to 18;

(C) a monoamine compound represented by Formula (IV):

(IV)

wherein each of $R^{11}$, $R^{12}$ and $R^{13}$ is independently selected from the group consisting of hydrogen atom, an alkyl group having 1 to 8 carbon atoms, an alkanol group having 1 to 8 carbon atoms, an alkanediol group having 1 to 8 carbon atoms, an alkanetriol group having 1 to 8 carbon atoms and a group represented by $-(R^{14}O)_cR^{15}$; $R^{14}$ is an alkylene group having 1 to 4 carbon atoms; $R^{15}$ is at least one selected from the group consisting of hydrogen atom, an alkyl group having 1 to 18 carbon atoms and an acyl group having 1 to 18 carbon atoms; and c is an integer of from 1 to 20, with proviso that:

(i) at least one of $R^{11}$, $R^{12}$ and $R^{13}$ is selected from the group consisting of an alkanediol group having 1 to 8 carbon atoms, an alkanetriol group having 1 to 8 carbon atoms and a group represented by $-(R^{14}O)_cR^{35}$, wherein $R^{35}$ is selected from the group consisting of an alkyl group having 1 to 18 carbon atoms and an acyl group having 1 to 18 carbon atoms; and (ii) in a case where at least one of $R^{11}$, $R^{12}$ and $R^{13}$ is selected from the group consisting of an alkanol group having 1 to 8 carbon atoms and a group represented by $-(R^{14}O)_cH$, at least one of the other groups is an alkyl group having 1 to 8 carbon atoms;

(D) a polyamine having at least three amino groups in its molecule;

(E) an ether group-containing amine; and (F) a heterocyclic compound having nitrogen atom.

7. The polishing process according to claim 6, wherein the polishing composition further comprises an abrasive, a pH adjusting agent, or a mixture thereof.

* * * * *